US008386864B2

(12) United States Patent
Dubey et al.

(10) Patent No.: US 8,386,864 B2
(45) Date of Patent: Feb. 26, 2013

(54) LOCALLY SYNCHRONOUS SHARED BIST ARCHITECTURE FOR TESTING EMBEDDED MEMORIES WITH ASYNCHRONOUS INTERFACES

(75) Inventors: Prashant Dubey, Uttar Pradesh (IN); Akhil Garg, Uttar Pradesh (IN); Sravan Kumar Bhaskarani, Karnataka (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 0 days.

(21) Appl. No.: 13/361,749

(22) Filed: Jan. 30, 2012

(65) Prior Publication Data

US 2012/0198291 A1    Aug. 2, 2012

Related U.S. Application Data

(63) Continuation of application No. 11/891,848, filed on Aug. 13, 2007, now Pat. No. 8,108,744, which is a continuation-in-part of application No. 11/605,833, filed on Nov. 28, 2006, now Pat. No. 7,954,017.

(51) Int. Cl.
*G01R 31/28* (2006.01)

(52) U.S. Cl. ......................... 714/727; 714/733
(58) Field of Classification Search ................ None
See application file for complete search history.

(56) References Cited

U.S. PATENT DOCUMENTS

| | | |
|---|---|---|
| 6,671,844 B1 | 12/2003 | Krech et al. |
| 6,988,230 B2 | 1/2006 | Vermeulen et al. |
| 2006/0107160 A1 | 5/2006 | Ricchetti et al. |
| 2009/0132881 A1* | 5/2009 | Whetsel ........................ 714/731 |

OTHER PUBLICATIONS

Jens Muttersbach, Globally-Asynchronous Locally Synchronous Architectures for VLSI Systems, 2001.*
Mounir Benabdenbi, Walid Maroufi and Meryem Marzouki CAS-BUS: A Test Access Mechanism and a Toolbox Environment for Core-Based System Chip Testing 2002.*
Akarsh Reddy Ravi, Globally-Asynchronous Locally Synchronous Wrapper Configurations for Point-To-Point and Multi-Point Data Communication, 2001.*
Mounir Benabdenbi, et al., "CAS-BUS: A Test Access Mechanism and a Toolbox Environment for Core-Based System Chip Testing", Journal of Electronic Testing: Theory and Applications 18, 455-473, 2002, pp. 91-109.
Erik Jan Marinissen, et al., "On IEEE P1500's Standard for Embedded Core Test", Journal of Electronic Testing: Theory and Applications 18, 365-383, 2002, pp. 1-19.

* cited by examiner

*Primary Examiner* — Guerrier Merant
(74) *Attorney, Agent, or Firm* — Munck Wilson Mandala, LLP

(57) ABSTRACT

A system and method of sharing testing components for multiple embedded memories and the memory system incorporating the same are disclosed. The memory system includes multiple test controllers, multiple interface devices, a main controller, and a serial interface. The main controller is used for initializing testing of each of the dissimilar memory groups using a serial interface and local test controllers. The memory system results in reduced routing congestion and faster testing of plurality of dissimilar memories. The present disclosure further provides a programmable shared built in self-testing (BIST) architecture utilizing globally asynchronous and locally synchronous (GALS) methodology for testing multiple memories. The built in self-test (BIST) architecture includes a programmable master controller, multiple memory wrappers, and an interface. The interface can be a globally asynchronous and locally synchronous (GALS) interface.

20 Claims, 6 Drawing Sheets

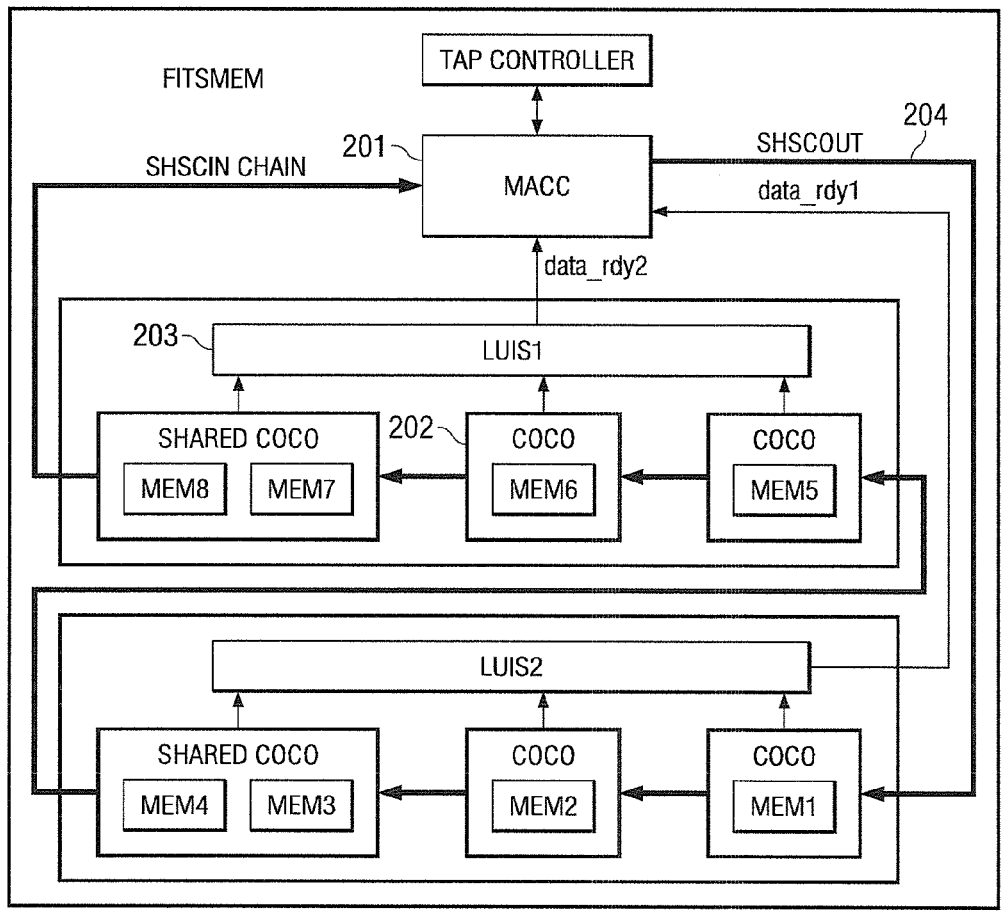
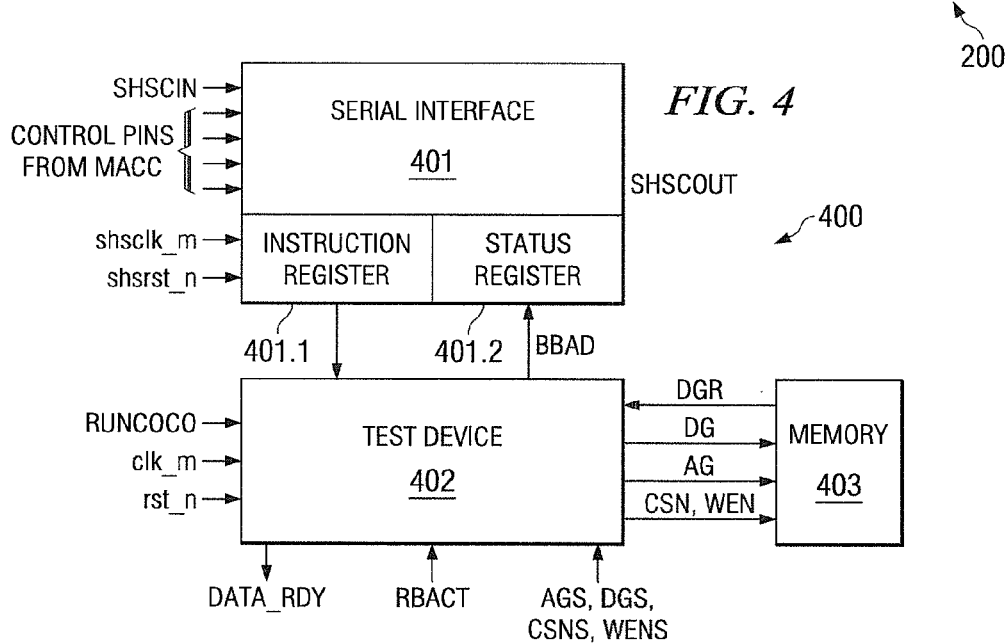

LOCALLY SYNCHRONOUS SHARED BIST ARCHITECTURE FOR TESTING EMBEDDED MEMORIES WITH ASYNCHRONOUS INTERFACES

CROSS-REFERENCE TO RELATED APPLICATIONS

This application is a continuation of prior U.S. patent application Ser. No. 11/891,848 filed on Aug. 13, 2007, now U.S. Pat. No. 8,108,744, which claims priority under 35 U.S.C. §120 as a continuation-in-part of U.S. patent application Ser. No. 11/605,833 filed on Nov. 28, 2006, now U.S. Pat. No. 7,954,017, which are hereby incorporated by reference.

TECHNICAL FIELD

The present disclosure relates to testing embedded memories and in particular to systems and methods for sharing testing components for multiple memory types.

BACKGROUND

Memories are critical to conventional Application-Specific Integrated Circuits (ASIC). As integrated circuit technology advance, the complexity and density of circuit devices formed within a single integrated circuit (IC) has increased dramatically. Consequently, several problems have arisen with regard to testing ICs. For example, while the conventional testing methodologies for a memory array within an IC may be relatively straight forward, ICs typically have far fewer I/O pins available to an external circuit tester than are required to adequately test the memory array.

A general solution to the above-described and other difficulties with external testing is to embed test circuitry within the IC itself. Such integrated testing facilities are frequently referred to as built-in self-test (BIST), array self-test (AST), or array built-in self-test (ABIST) circuits and will hereinafter be referred to generally as BIST circuits.

Although the integration of BIST circuits within ICs facilitates IC testing, a central concern associated with BIST circuits is the large amount of die size consumed by the BIST circuit and associated circuitry. This concern is magnified as the number of memory arrays and other sub circuits integrated within an IC that requires BIST testing multiply. This concern is particularly significant for state-of-the-art integrated circuits, such as a microprocessors and Application-Specific Integrated Circuits (ASICs), which commonly contain hundreds or thousands of relatively small memory arrays each requiring BIST testing.

One conventional system uses a common controller which controls the test activities on the entire chip while supporting a broad range of memory types like single port, dual port, register files and ROM. This is possible only due to a proper partitioning of the whole BIST system. However, the shared approach of this integrated circuit has a lot of parallel connections and hence occupies a lot of area due to routing congestion.

The concept of BIST is used for at-speeds equivalent to its application speed. Having a controller per BIST to run the desired algorithm as well as manage the repair activities will result in increased area and hence an increase in overall testing cost. Also more efforts will be needed at the time of chip integration. Thus various state of the art solutions are being given to share the test and repair resources across the plethora of memories on the chip. But then due to improper partitioning of the whole structure, the ultimate implementation becomes cumbersome as well as routing congestion prone as well as less than at-speed.

In existing architectures, the controller is embedded inside the BIST which controls the test activities. As the algorithm for testing single and dual port memories are different, the controller inside the BIST is hard coded for the desired algorithm. Thus, the controller's architecture changes from one memory type to other. As these controllers are replicated, for all the memories it results in lot of silicon area.

FIG. 1 depicts a conventional shared BIST architecture 100. In architecture 100, a common controller 101 interacts with only the tester. The different memory groups each have their own different controllers or have dedicated collars for the algorithm. In the latter case, all the memories are connected in parallel which increases the routing congestion and thus makes the BIST architecture highly floor plan dependent.

Accordingly, conventional systems and methods occupy a lot of area and experience routing congestion due to the various parallel connections between the memories. Conventional approaches make the BIST highly floorplan dependent and thus limit sharing memories which are physically close to each other. In addition, memories of different clock domain cannot be shared. For smaller conventional memories with large word widths, the gains are relatively small because the collar area cannot be reduced. Accordingly, gains cannot be shared between various memories nor can different types of memories be shared.

At-speed testing is not easily possible using conventional systems and methods. Either significant areas are wasted to achieve the at-speed testing or at-speed testing is simply not possible. Moreover, integration is a big issue for the user as the BIST area and performance becomes chip floor plan dependant. As more parallel lines are running for long distances, BIST defects can itself lower the yield of the chip. Conventionally shared BIST methodology is not easily programmable or even if programmability was possible, a lot of area is wasted.

The conventional BIST architectures are either dedicated BISTs or shared BISTs. In a dedicated BIST, a controller, which controls the test activities, is embedded inside the BIST. The algorithm for testing single or dual port memories is hard coded into the controller. Thus the controller's architecture changes from one memory type to another. As these controllers are replicated, for all the memories, it results in lot of silicon area. This lead to the development of shared BISTs.

In a shared BIST, there is a common controller that interacts with the memories to be tested. Different memory groups either have different controllers or dedicated collars for the algorithm. All the memories are connected in parallel and this result in increased routing congestion and the BIST architecture is highly floor dependent. Also synchronous transmission of data between a central controller and wrappers placed near a memory introduce power loss.

Sometimes sharing is not possible because of the physical orientation and layout. Thus it becomes a challenging task to share the BIST among different memories placed in different parts of a chip.

Further, different memories on the chip may execute on different clock domains and sometimes on totally uncorrelated clocks. This leads to a situation wherein either the BIST cannot be shared or at-speed test is not possible and thus loosing the fault coverage. Hence, the BIST architecture should be partitioned in such a manner, that the at-speed components are not shared.

With the shrinking technology, newer defects like Vt-mismatch, resistive bridging, etc., has developed which results in multiple read failure, data retention failure, etc. Test clock routing is another challenge that needs to be taken into consideration, as it has to be balanced and clock tree routing is required.

Conventional architectures based on serial architecture have been proposed to achieve floor plan independence. But, they do not allow asynchronous transfer and are not programmable. Moreover, the conventional architectures that are programmable are not sharable.

There is a need for a common controller to control the test activities on the entire chip while supporting a broad range of memory types like single port, dual port, register files and ROM.

SUMMARY

The present disclosure generally provides a memory system and a method of sharing test components for multiple embedded memories. In one embodiment, for example, the present disclosure provides a sharable BIST architecture having asynchronous links for data transmission. The architecture is programmable and eases the task of clock routing with low power utilization.

In one embodiment, the present disclosure provides a memory system. The memory system includes dissimilar memory groups each having at least one memory type and local test controllers each coupled to at least one of said memory types to generate a control signal. The memory system could also include interface devices coupled to one of said dissimilar memory group to receive said control signals. The memory system could further include a main controller to randomly initialize one of said local test controllers to test each of said dissimilar memory groups. The memory system could still further include a serial interface connecting said local test controllers and main controller in a ring configuration for said random initialization.

In another embodiment, the present disclosure provides a method for testing multiple memories embedded in a chip. The method includes partitioning said multiple memories in said shared memory test architecture into a plurality of dissimilar memory groups. The method could also include initializing a plurality of local test controllers associated with one of said dissimilar memory groups by a main controller. The method could further include testing memories using initialized local test controllers and generating a control signal associated with said initialized local test controllers for the main controller on completion of said testing. The method still further include repeating said initializing, said testing and said generating for each of said plurality of dissimilar memory groups. The method could further include transferring a status of said plurality of dissimilar memory groups to the main controller.

In still another embodiment, the present disclosure provides a built-in self test system for reduced routing congestion for dissimilar memories each having at least one memory type. The system includes local test controllers each coupled to at least one of said memory types to generate a control signal. The system could also include interface devices coupled to one of said dissimilar memory group to receive said control signals. The system could further include a main controller to randomly initialize one of said local test controllers to test each of said dissimilar memory groups and a serial interface connecting said local test controllers and main controller in a ring configuration for said random initialization.

In still another embodiment, the present disclosure provides a locally synchronous shared built in self test (BIST) architecture for testing a plurality of embedded memories. The architecture includes a programmable master controller for initializing the testing by generating and controlling a plurality of control signals. The architecture could also include one or more memory wrappers operatively coupled to the programmable master controller for executing the plurality of control signals. The architecture could further include an interface coupled to the programmable master controller and the one or more memory wrappers for the initializing.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which:

FIG. 2 illustrates a memory system according to one embodiment of the present disclosure;

FIG. 4 is a block diagram of the local test controller of said memory system according to one embodiment of the present disclosure;

DETAILED DESCRIPTION

The present disclosure relates to a memory system which provides Floor plan Independent Built-In Self Test for Multiple Embedded Memories (FITSMEM), using shared test components.

According to one embodiment of the present disclosure, a common controller on the chip controls the test activities of all the memories. The present disclosure partitions the existing memory Built-In Self Test (BIST) architecture by separating out the at-speed memory. Size dependent parts like Address generator, Data Generator, Comparator and Control FSM are kept near the memory. These size dependent parts are combined to form a configurable collar in which the algorithms are programmable, thus reducing the collar size drastically.

On the other hand, information that is not memory size dependant and that need to be applied at a slower speed such as, for example, an algorithm march element, a stress pattern, a direction of the march element and a number of the operation in the march element, are kept at a central place and programmed each time through a serial interface.

FIG. 2 is a diagram for a memory system 200 showing the connection between the major components of said architecture (i.e., main controller or MACC 201, local controller or COCO 202 and interface device or LUIS 203) on a chip according to one embodiment of the present disclosure. The memories which need testing are coupled with the corresponding COCO. The COCOs are inter-connected serially in the form of a chain 204 across the chip. According to one embodiment of the present disclosure, a COCO may be shared among memories of the same size to further reduce the area. Moreover, the present disclosure allows the serial interface of COCOs of memories that are of the same type but may be made of different sizes to be shared, to reduce the area further. However, there may be a trade off with respect to routing congestion.

Figure 1:
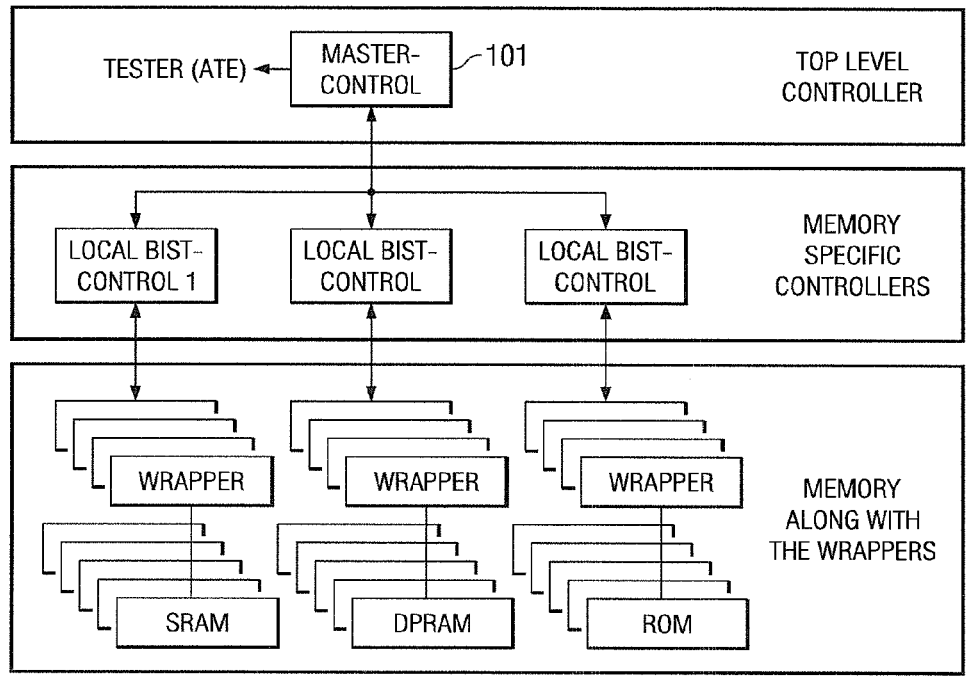
FIG. 1 is a block diagram of a conventional shared BIST architecture.
Figure 3:
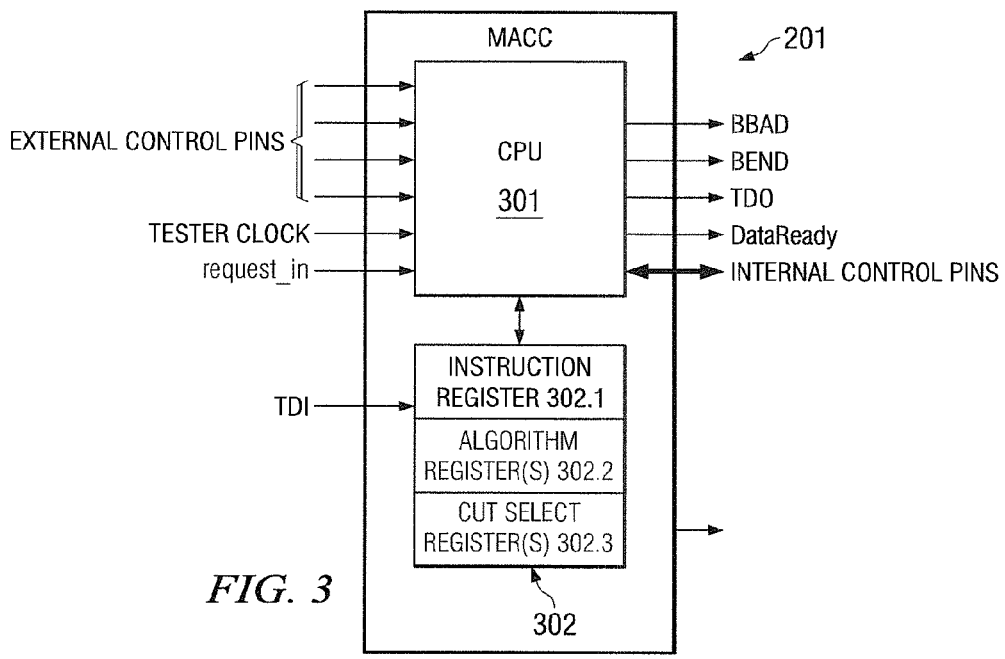
FIG. 3 is a block diagram of the main controller of said memory system according to one embodiment of the present disclosure.

FIG. 3 is a block diagram of the main controller (MACC) 201 of a memory system according to one embodiment of the present disclosure. The main controller includes a central processing unit 301 that handles all the memories on the chip. The main controller 201 also includes a plurality of registers blocks 302 having instruction register 302.1, algorithm register 302.2 and cut select register 302.3. The central processing unit 301 generates a set of control signals for the other components of the shared architecture responsive to the external control pins, tester clock and request_in. Cut selection, algorithm selection, algorithm configurations are performed by programming the MACC 201. The MACC 201 applies a particular selected algorithm, on the selected cuts on the chip. These features augment the capability of the MACC 201 as a diagnostic mechanism as well as enables a power conscious test circuit.

FIG. 4 shows a block diagram of the local test controller 400 of a memory system according to one embodiment of the present disclosure. The two main components of the local test controller are the serial interface block (401) and the test device or COCO collar (402).

Serial Interface block (401) includes main Registers like instruction register (401.1) and status register (401.2) which can be programmed by selecting the appropriate mode. The Serial Interface block (401) is working on shsclk_m, which is a low frequency clock. The serial interface block (401) receives the control signals from main controller 301 through the control pins and generates an output signal shscout.

Depending upon the March elements programmed in the instruction register (401.1) of the Serial Interface the COCO collar (402) performs the operation on the memory and after the end of March run generates the asynchronous data ready signal for the MACC to signify the end of operation. The test controller block generates a set of control signals for the memory (403). The COCO collar (402) is running at clk_m to support at speed testing as this is a high speed clock at which the memory will run during its application. Thus COCO collar (402) supports at speed testing of the memories.

Figure 5:
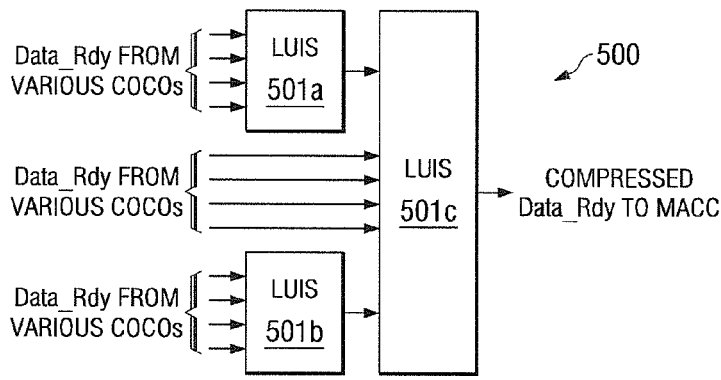
FIG. 5 illustrates a block diagram illustrating the arrangements of LUIS of said memory system according to one embodiment of the present disclosure.

FIG. 5 is a block diagram system 500 having an arrangement of LUIS 501a, 501b and 501c (collectively referred to herein as 501) of said memory system according to one embodiment of the present disclosure. The LUIS 501 or interface device acts as a handshake between the COCOs or test controller and the MACC or main controller. This handshake is implemented by giving out a dataready signal from each COCO. Thus, whenever a particular task is finished or a data is ready to be released by a COCO, the COCO sets a dataready flag to alert the MACC. The LUIS is provided to reduce the routing congestion arising from the large number of dataready pins. The LUIS monitors the dataready status of each memory and generates one data ready status for the MACC. The outputs of multiple LUIS may be fed to one LUIS to reduce the congestion further.

Generally, the memory system operates by programming the Cut Select Register in the MACC for those memories that require testing in a given run. Next, the system orders the Cuts in the Cut Select Register in the same order as the order in which the COCOs are connected in the serial interface or chain on the chip. The system then programs the Instruction register to select a particular Algorithm. When MACC goes in the run mode it programs the March elements of the selected algorithm in the serial interface of the COCO for memory testing.

While programming the Cut select register to Run the COCO of one memory type, the system bypasses COCO of the other types of memory. Next, the system bypasses the Serial Interface of the bypassed COCO by programming the corresponding bypass bit to '1' in order to bypass its serial chain. The FSM of these COCO collar will not run. After the MACC has gone into the Run mode, it waits for the data ready signal from the LUIS. Then, after receiving the data ready signal from the LUIS, the MACC goes in the capture mode to capture the good/bad status of the memory in the status register of the COCO serial Interface. This status can then be shifted out to decide which of the selected cut is good or bad. Once the algorithm is over the MACC signifies the end of operation using bend signal otherwise MACC again pings the COCO for the next march elements of the selected algorithm.

Figure 6:
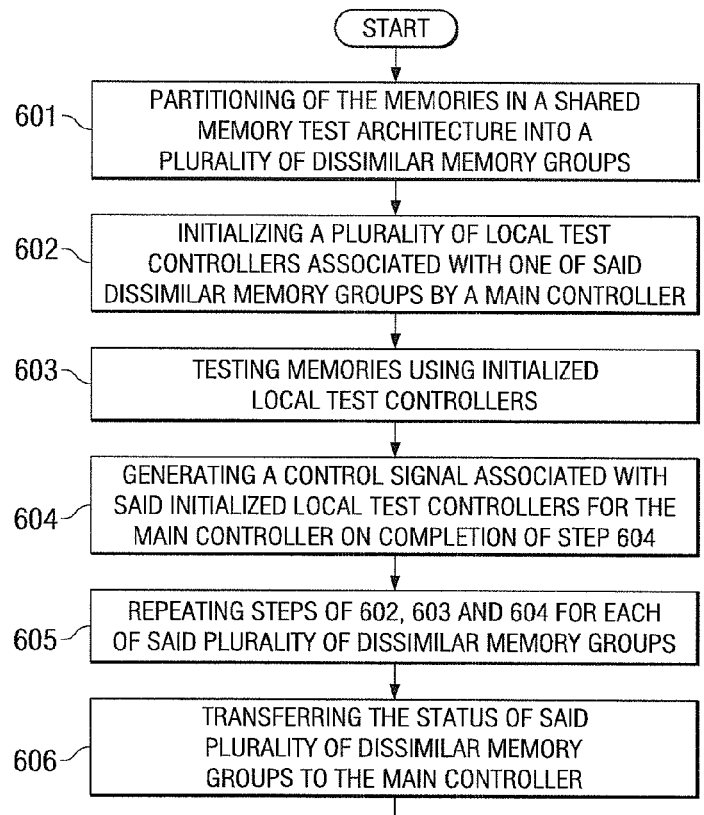
FIG. 6 illustrates a flow diagram of a method, according to one embodiment of the present disclosure.

FIG. 6 is a somewhat simplified flow diagram of a method according to one embodiment of the present disclosure. The multiple embedded memories are partitioned on the basis of speed, memory size, dependent parts, etc. in step 601 resulting in a plurality of dissimilar memory groups. In step 602 the main controller randomly initializes a plurality of local test controllers associated with one of the dissimilar memory groups. The initialized local test controllers are used for testing the associated memories in step 603. Each of said local test controllers associated with a dissimilar memory group generates a control signal on completion of testing. The plurality of control signals is combined to form a single control signal for the main controller in step 604. Steps 602 to 604 are repeated for each of said plurality of dissimilar memory groups in step 605. Finally, the status of the plurality of dissimilar memory groups is transferred to the main controller in step 606.

Accordingly, the present disclosure enables proper partitioning of the entire BIST system. The at-speed parts are kept near the memory, while the static or low speed parts are shared. This results in significant area saving, thus reduces the test cost. It is an objective of the present disclosure to provide a memory system having Built-In Self Test utilizing minimum area. It is also an object of the present disclosure to provide a memory system having an efficient subsystem for testing of memories. It is still another objective of the present disclosure to provide a memory system, with Built-In Self Test for any size of the memory and any number of memories. It is a further objective of the present disclosure to provide a memory system, with Built-In Self Test for multiple embedded memories (FITSMEM), which is floor plan independent.

Figure 7:
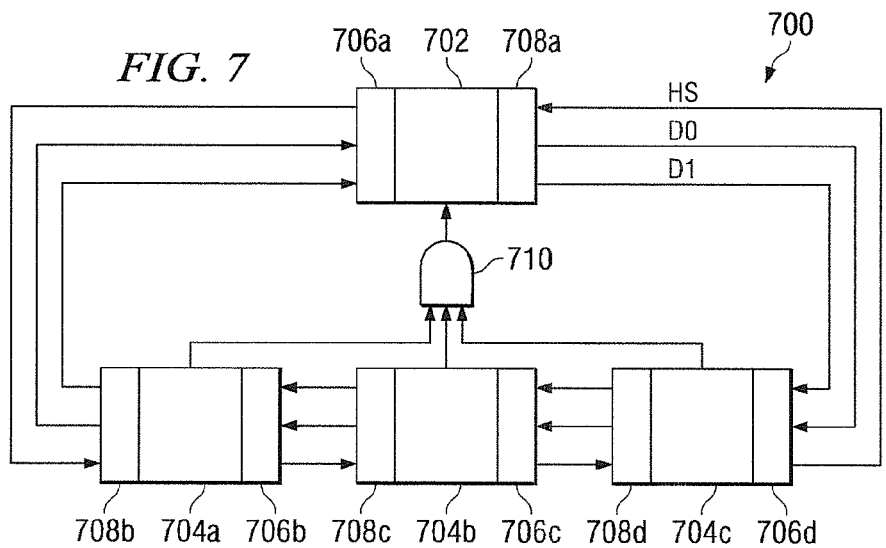
FIG. 7 illustrates a block diagram of a BIST architecture according to the present disclosure.

FIG. 7 illustrates a block diagram of a BIST architecture 700 according to the present disclosure. The BIST architecture 700 includes a programmable master controller 702 having a receiver 706a and a transmitter 708a, multiple memory wrappers, such as 704a, 704b and 704c. The memory wrappers include receivers such as 706b, 706c and 706d, transmitters 708b, 708c and 708d. The architecture further includes a logic gate 710. In an embodiment, the logic gate 710 can be an AND gate.

The programmable master controller 702 is connected between the receiver 706a and the transmitters 708a and to the memory wrapper 704a, 704b and 704c through an asynchronous link. The memory wrappers 704a, 704b and 704c are connected between the receivers 706b, 706c and 706d and the transmitters 708b, 708c and 708d respectively and to the logic gate 710. The logic gate 710 is connected to the programmable master controller 702. The memory wrappers 704a, 704b and 704c contain an address generator, a data generator, a comparator, a control finite state machine (FSM), and an operation FSM.

The programmable master controller 702 includes a central processing unit to initialize the testing of the embedded memories and having multiple registers connected to the central processing unit to configure the testing of the embedded memories. The registers include an algorithm register to configure a test algorithm for the programmable master controller 702, a cut select register to configure selection of the memories under test and an instruction register for selecting instructions for algorithm in the algorithm register.

Figure 8:
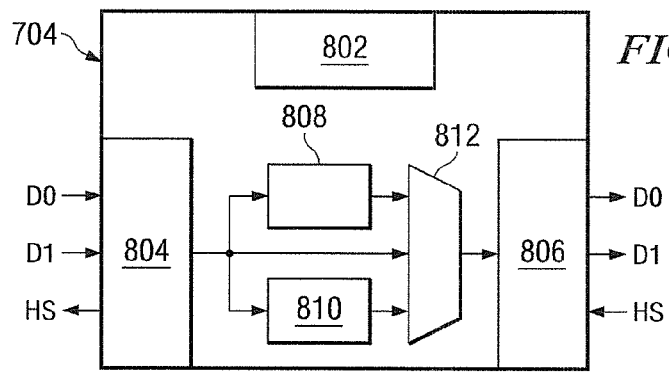
FIG. 8 illustrates a block diagram of a memory wrapper according to an embodiment of the present disclosure.

FIG. 8 illustrates a block diagram of the memory wrapper 704 according to the present disclosure. The memory wrapper 704 includes a memory 802, a GALS interface receiver 804 and a GALS interface transmitter 806, an instruction register 808, a status register 810 and a multiplexer 812.

The programmable master controller 702 starts with an algorithm programming mode, i.e., algorithms for all types of memories, such as, dual port, single port RAM and ROM are programmed. If no external algorithm is programmed the programmable master controller 702 carries on with a default algorithm. The programmable master controller 702 selects the cuts which need to be tested. This can be externally programmed into the master controller 702. The master controller 702 enters a run mode and connects only one type of memory in the asynchronous link by bypassing the other memories. The master controller 702 shifts march element information to an instruction register of each of the memory wrappers 704a, 704b and 704c and set the wrappers 704a, 704b and 704c active to test the corresponding memories. For doing this, the master controller 702 has an asynchronous ring architecture in which it programs the march elements into the wrappers 704a, 704b and 704c one after another on a time division basis.

While the wrappers 704a, 704b and 704c are executing the march test, the master controller 702 bypasses the GALS interfaces of these wrappers and connects the other type of memory and performs similar operations. Then the master controller 702 waits for any of the memory types to finish the test and then a test status is shifted out serially to the master controller 702 and a new march element is then programmed. Thus the master controller 702 collects the status from the different wrappers and generates a global chip status. The master controller 702 also collects the data from the memory wrappers working in the debug mode. The wrappers run at memory's functional clock making at-speed testing viable. Priority encoding is used to resolve any contention related issues.

The GALS architecture consists of a transmitter and a receiver. The programmable master controller 702 and each of the memory wrappers 704a, 704b and 704c have a transmitter and a receiver.

Figure 9:
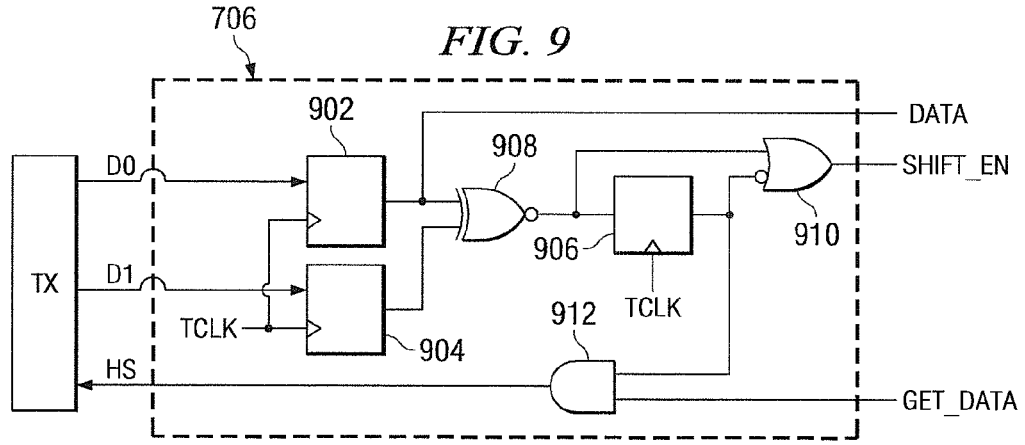
FIG. 9 illustrates a block diagram of a receiver according to an embodiment of the present disclosure.

FIG. 9 illustrates a block diagram of the receiver 706 according to an embodiment of the present disclosure. The receiver 706 includes multiple flip flops such as 902, 904 and 906, an exclusive NOR gate 908, an OR gate 910, and an AND gate 912.

Figure 10:
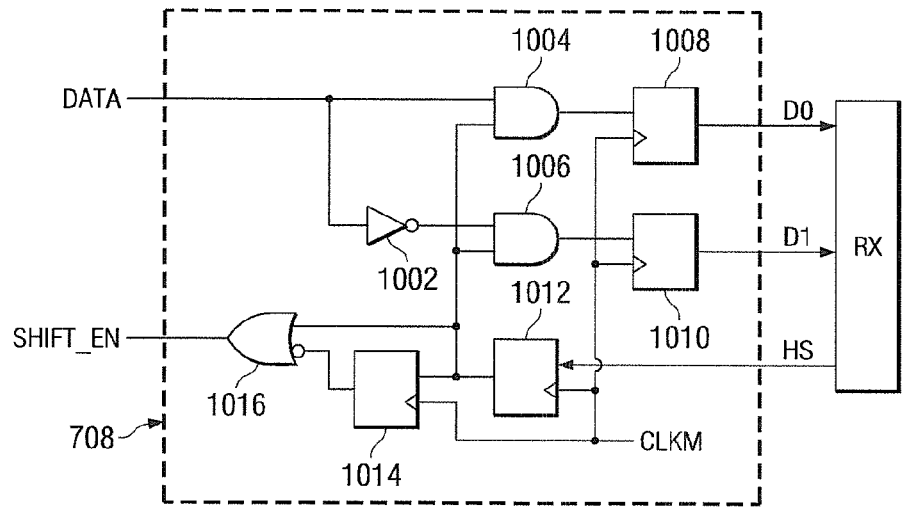
FIG. 10 illustrates a block diagram of a transmitter according to an embodiment of the present disclosure.

FIG. 10 illustrates a block diagram of the transmitter 708 according to an embodiment of the present disclosure. The transmitter 708 includes a NOT gate 1002, AND gates 1004 and 1006, multiple flip flops such as 1008, 1010, 1012 and 1014, and an OR gate 1016.

In an embodiment of the present disclosure, the data transfer process in explained in following paragraphs. The data is transferred using dual lines, i.e., D0 and D1, along with a handshake signal HS. When the data is transmitted, by default the handshake signal HS will be at '0' state and SHIFT_EN will be at '1' state. Hence no shifting and no data transfer takes place between the transmitter 708 and the receiver 706. Two clocks (CLKM) after GET_DATA at the receiver 706 goes '1', the values D0 and D1 will be complementary and indicates the receiver 706 to receive the data. The transmitter 708 waits for the handshake signal HS to go low as an acknowledgement of the data being received by the receiver 706. As soon as the transmitter 708 receives low on the handshake signal HS, the transmitter 708 latches this value on CLKM clock edge. SHIFT_EN of the transmitter 708 is made '0' for one clock cycle (CLKM), enabling the shift registers to shift a bit and bring in new data to be send to the receiver. After one clock cycle, it makes both D0 and D1 to '0'. This is the completion of one data bit transfer from the transmitter end. Now, the transmitter 708 waits until it finds a '1' on HS to send a new data.

While receiving data, by default, the handshake signal HS is put at '0' and is made '1' by asserting GET_DATA and is held at '1' until the whole data transmission is completed. SHIFT_EN of the receiver 706 will be at '1'. As soon as the receiver 706 latches the data, sent by the transmitter 708, through D0 and D1 (~D0) at the TCK edge, it makes SHIFT_EN '0' for one clock cycle (TCK), allowing the capture of the data in the shift registers. After the next clock cycle (TCLK), the receiver 706 acknowledges the transmitter 708 by making the handshake signal HS low. The receiver 706 gets an acknowledgement from the transmitter 708 by receiving '0's on both D0 and D1. After a clock cycle, the receiver 706 puts back the handshake signal HS to '1' and informs the transmitter 708 to send a new data in case GET_DATA is still held high. The receiver 706 keeps track of the data to be transmitted. After the required transmission is completed, the signal GET_DATA can be made '0'.

Figure 11:
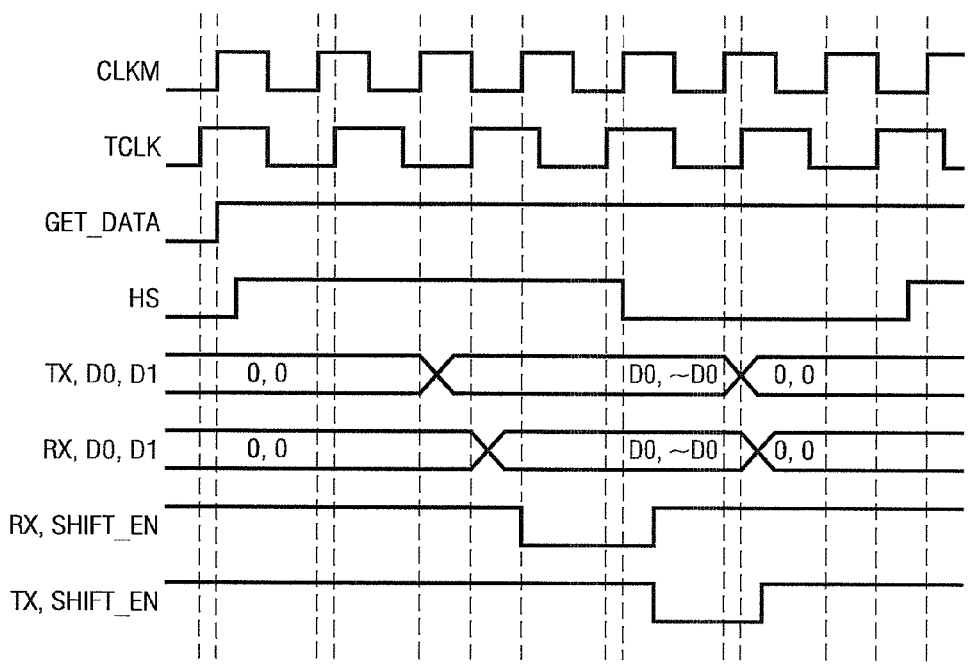
FIG. 11 illustrates a waveform showing the behaviors of different signals during a bit transmission according to the present disclosure.

FIG. 11 illustrates a waveform showing the behaviors of different signals during a bit transmission according to the present disclosure.

Figure 12A:
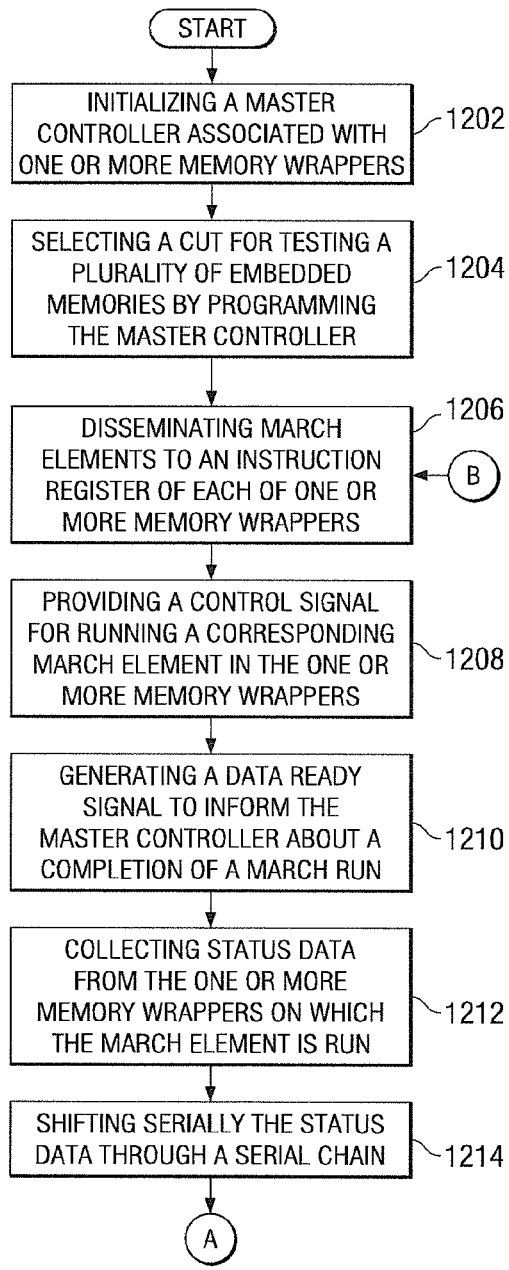
FIG. 12A and FIG. 12B illustrate a flow diagram of a method according to the present disclosure.
Figure 12B:
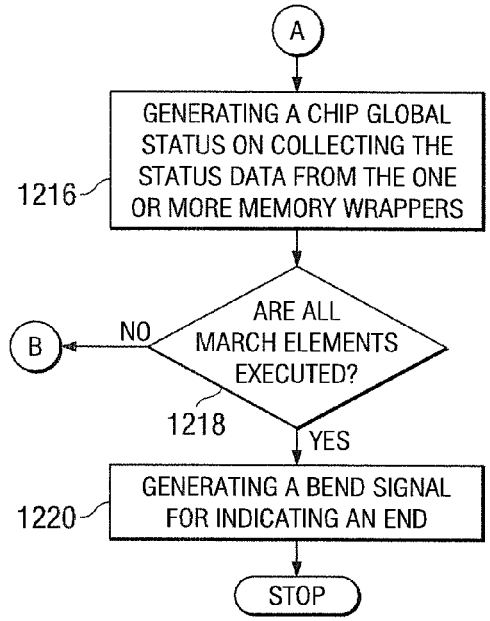

FIG. 12A and FIG. 12B illustrate a flow diagram of a method of testing a plurality of embedded memories according to the present disclosure. At step 1202, a master controller associated with one or more memory wrappers is initialized. At step 1204, a cut is selected for testing a plurality of embedded memories by programming the master controller. At step 1206 march elements are disseminated to an instruction register of each of a one or more memory wrappers. At step 1208 a control signal is provided for running a corresponding march element in the one or more memory wrappers. At step 1210 a data ready signal is generated to inform the master controller about a completion of a march run. At step 1212 status data is collected from the one or more memory wrappers on which the march element is run. At step 1214, the status data is shifted serially through a serial chain. At step 1216, a chip global status is generated on collecting the status data from the one or more memory wrappers. At step 1218, a check is performed to ascertain whether all the march elements are executed. A bend signal is generated for indicating an end as shown in step 1220. If all the march elements are not executed, then steps 1206 onwards is repeated.

As the algorithms and the patterns are shifted serially into the wrappers through the GALS interface, the architecture becomes inherently programmable without any area overhead.

Besides a default algorithm, an externally programmed algorithm may also be applied. The GALS interface acts like a serial conduit which is used to collect various failure data for debugging and repair purposes. Once the data of bitmapping is available to the master controller, it analyzes the data of bitmapping to generate the bitmap diagnosis or programs fuses or flash memories connected to it. Thus considerable amount area is shared.

It is an object of the present disclosure to provide a programmable shared built in self testing (BIST) architecture utilizing an interface for testing multiple memories.

It is another object of the present disclosure to provide a BIST architecture which is floor independent and reduces routing congestion.

In one embodiment, the present disclosure provides a memory system. The memory system includes dissimilar memory groups each having at least one memory type and local test controllers each coupled to at least one of said memory types to generate a control signal. The memory system also includes interface devices coupled to one of said dissimilar memory group to receive said control signals and a main controller to randomly initialize one of said local test controllers to test each of said dissimilar memory groups. The memory system further includes a serial interface connecting said local test controllers and main controller in a ring configuration for said random initialization.

In another embodiment, the present disclosure provides a method for testing multiple memories embedded in a chip. The method includes partitioning said multiple memories in said shared memory test architecture into a plurality of dissimilar memory groups and initializing a plurality of local test controllers associated with one of said dissimilar memory groups by a main controller. The method also includes testing memories using initialized local test controllers and generating a control signal associated with said initialized local test controllers for the main controller on completion of said testing. In addition, the method also includes repeating said initializing, said testing and said generating for each of said plurality of dissimilar memory groups and transferring a status of said plurality of dissimilar memory groups to the main controller.

In still another embodiment, the present disclosure provides a built-in self test system for reduced routing congestion for dissimilar memories each having at least one memory type. The system includes local test controllers each coupled to at least one of said memory types to generate a control signal and interface devices coupled to one of said dissimilar memory group to receive said control signals. The system also includes a main controller to randomly initialize one of said local test controllers to test each of said dissimilar memory groups and a serial interface connecting said local test controllers and main controller in a ring configuration for said random initialization.

To achieve the aforementioned objectives, the present disclosure could generally provide a locally synchronous shared built in self test (BIST) architecture for testing a plurality of embedded memories including a programmable master controller for initializing the testing by generating and controlling a plurality of control signals. The BIST architecture could also include one or more memory wrappers operatively coupled to the programmable master controller for executing the plurality of control signals. The BIST architecture could also include an interface coupled to the programmable master controller and the one or more memory wrappers for the initializing.

In other embodiments, the present disclosure provides a method of testing a plurality of embedded memories through a synchronous shared built in self test (BIST) architecture. The method could include: (a) initializing a master controller associated with one or more memory wrappers; (b) selecting a cut for testing the plurality of embedded memories by programming the master controller; (c) disseminating march elements to an instruction register of each of the one or more memory wrappers; (d) providing a control signal for running a corresponding march element in the one or more memory wrappers; (e) generating a data ready signal to inform the master controller about a completion of a march run; (f) collecting status data from the one or more memory wrappers on which the march element is run; (g) shifting serially the status data through a serial chain; (h) generating a chip global status on collecting the status data from the one or more memory wrappers; (i) repeating steps "c" onwards for subsequent march elements; and (j) generating a bend signal for indicating an end.

The present disclosure offers several advantages. For example, the novel architecture reduces routing congestion by using globally asynchronous and locally synchronous (GALS) interface. As a second example, as the algorithms and the patterns are shifted serially into the wrapper through the GALS interface, the architecture becomes inherently programmable without any area overhead. As a third example, serial and asynchronous communication avoids routing of a test clock to the wrappers. As a fourth example, floor-plan independence is achieved as there is serial asynchronous transmission of data.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A locally synchronous shared built in self test (BIST) architecture for testing a plurality of embedded memories, comprising:
   a programmable master controller configured to initialize testing by generating and controlling a plurality of control signals; and
   one or more interface receivers and one or more interface transmitters each operatively coupling a memory to the programmable master controller and configured to respond to the plurality of control signals, the interface receivers configured to latch data on two data inputs in response to a handshake signal and the interface transmitters configured to transmit complementary signals onto two data outputs for transmission of a data bit data in response to the handshake signal.

2. The architecture of claim 1, wherein the programmable master controller is configured to select test cuts, store algorithms for the plurality of embedded memories, disseminate march elements into the one or more interface receivers, and collect a status from the one or more interface transmitters to generate a global chip status.

3. The architecture of claim 1, wherein the programmable master controller comprises:
a central processing unit configured to initialize the testing on the plurality of embedded memories; and
a plurality of registers coupled to the central processing unit and configured to define the testing of the plurality of embedded memories.

4. The architecture of claim 3, wherein each of the plurality of registers comprises:
an algorithm register configured to identify a test algorithm for the programmable master controller;
a cut select register configured to define selection of the plurality of memories under test; and
an instruction register configured to select instructions for an algorithm identified in the algorithm register.

5. A system, comprising:
a master controller configured to perform integrity testing on at least one memory using at least one instruction register; and
a plurality of memory devices each having a local controller connected in series to form a chain coupling the master controller in the series, wherein at least one of the memory devices comprises a local interface for communication with the master controller,
wherein the master controller is configured to selectively communicate with the at least one memory device by programming a bypass bit in the local controller to bypass the serial chain and to communicate through the local interface.

6. The system of claim 5, wherein each of the plurality of memory devices comprises interface.

7. The system of claim 6, wherein each of the plurality of memory devices comprises transmitter.

8. The system of claim 6, wherein each of the plurality of memory devices comprises receiver.

9. The system of claim 5, wherein the master controller is configured in an asynchronous ring architecture with the plurality of memory devices.

10. The system of claim 5, wherein each of the plurality of memory devices comprises at least one memory wrapper.

11. The system of claim 5, wherein the master controller is configured to program at least one march element into a first memory device of the plurality of memory devices on a time division basis.

12. The system of claim 11, wherein the master controller is configured to program the at least one march element into a second memory device of the plurality of memory devices on a time division basis while a march test is executed on the at least one march element in the first memory device.

13. The system of claim 11, wherein the first memory device is configured to execute a march test on the at least one march element at a functional clock speed of the first memory device.

14. A method, comprising:
initializing a master controller associated with a plurality of memory interfaces, each of the plurality of memory interfaces including one or more interface receivers and one or more interface transmitters, the interface receivers configured to latch data on two data inputs in response to a handshake signal and the interface transmitters configured to transmit complementary signals onto two data outputs for transmission of a data bit data in response to the handshake signal;
selecting a cut for testing a plurality of embedded memories by programming the master controller;
disseminating a plurality of march elements to an instruction register of at least one of the plurality of memory interfaces;
providing a control signal for running a march element in the at least one of the plurality of memory interfaces;
generating a data ready signal by the at least one of the plurality of memory interfaces; and
collecting data from the at least one of the plurality of memory interfaces by the master controller through at least one serial chain passing the data through the memory interfaces on a pair of complementary data lines controlled by the handshake signal.

15. The method of claim 14, further comprising:
executing a plurality of march tests on the plurality of march elements at the at least one of the plurality of memory interfaces.

16. The method of claim 15, further comprising:
generating a bend signal indicating an end of the plurality of march tests.

17. The method of claim 14, further comprising:
operating the master controller in an asynchronous ring architecture with the plurality of memory interfaces.

18. The method of claim 14, wherein each of the plurality of memory interfaces is integrated with at least one of the embedded memories.

19. The method of claim 14, wherein disseminating march elements to an instruction register of at least one of the plurality of memory interfaces is performed on a time division basis.

20. The method of claim 15, wherein the plurality of march tests are executed at a functional clock speed of the at least one of the plurality of memory interfaces.

* * * * *